United States Patent [19]

Colton et al.

[11] Patent Number: 5,218,760

[45] Date of Patent: Jun. 15, 1993

[54] METHOD OF GROUNDING A COMPUTER SYSTEM BOARD

[75] Inventors: James H. Colton, Houston; Francis A. Felcman, Rosenberg, both of Tex.

[73] Assignee: Compaq Computer Corporation, Houston, Tex.

[21] Appl. No.: 877,464

[22] Filed: May 1, 1992

Related U.S. Application Data

[62] Division of Ser. No. 620,272, Nov. 30, 1990, Pat. No. 5,138,529.

[51] Int. Cl.⁵ .............................................. H01R 9/14
[52] U.S. Cl. ..................................... 29/845; 361/408; 439/55; 439/92
[58] Field of Search ...................... 29/845; 439/92, 55, 439/82, 816; 361/408

[56] References Cited

U.S. PATENT DOCUMENTS

| | | | |
|---|---|---|---|
| 3,450,950 | 6/1969 | Tarrats | 361/408 X |
| 3,708,618 | 1/1973 | Hofmeister et al. | 178/7.9 |
| 3,747,044 | 7/1973 | Vaccaro . | |
| 3,992,897 | 11/1976 | Loos | 62/262 |
| 4,396,242 | 8/1983 | Kurano et al. . | |
| 4,505,527 | 3/1985 | Barkus | 439/82 |
| 4,640,979 | 2/1987 | Schmalzl | 174/35 GC |
| 4,688,148 | 8/1987 | Mallory et al. | 361/395 |
| 4,803,306 | 2/1989 | Malmquist | 174/35 GC |
| 5,001,297 | 3/1991 | Peregrim et al. | 174/35 GC |
| 5,043,528 | 8/1991 | Mohr | 174/35 GC |
| 5,047,898 | 9/1991 | Cooke et al. | 361/424 |

FOREIGN PATENT DOCUMENTS

| | | | |
|---|---|---|---|
| 222656 | 5/1987 | European Pat. Off. . | |
| 3436119 | 4/1986 | Fed. Rep. of Germany . | |
| 911875 | 7/1946 | France | 439/816 |
| 2-250276 | 10/1990 | Japan | 439/92 |

OTHER PUBLICATIONS

IBM Technical Disclosure Bulletin vol. 7, No. 2 Jul. 1964, p. 153 by J. M. Daughton et al.
Finnerman Dart-type Fasteners, Eaton Corporation (1987).

*Primary Examiner*—Carl J. Arbes
*Attorney, Agent, or Firm*—Konneker, Bush & Hitt

[57] ABSTRACT

A supportive ground clip for a computer system board mounted in a computer chassis and a method for installing a grounded printed circuit board in a computer shassis using the supportive ground clip. The supportive ground clip includes a base member for providing a grounding connection with the chassis, flexible support members attached to opposite ends of the base member and ascending vertical members attached to the flexible support members for mounting the supportive ground clip to the computer system board. Each of the flexible support members includes a contact point for providing a grounding connection with the bottom side of the computer system board and each of the ascending vertical members includes a contact point for providing a grounding connection with the top side of the computer system board. The first and second flexible support members are shaped such that compressive forces exerted on the supportive ground clip support the computer system board within the chassis. To install the computer system board, at least one electrically conductive grounding clip is mounted in an aperture provided in the board such that the grounding clip is positioned to engage grounding pads electrically connected to the board's components and such that at least part of the grounding clip extends below the board. The board is then slideably installed within the chassis and supportably mounted above the base by engaging the grounding clips and the base.

12 Claims, 2 Drawing Sheets

METHOD OF GROUNDING A COMPUTER SYSTEM BOARD

This is a division of application Ser. No. 07/620,272, filed Nov. 30, 1990 now U.S. Pat. No. 5,138,529, issued Aug. 11, 1992.

BACKGROUND OF THE INVENTION

1. Field of the Invention

The invention relates to a ground clip for a computer system board and, more particularly, to a ground clip which supportably mounts a computer system board above a computer system chassis base.

The invention further relates to a method for installing a grounded printed circuit board in a computer system chassis and, more particularly, to a method for installing a supportably grounded, slideably mountable printed circuit board in a computer system chassis.

2. Description of Related Art

A computer system typically includes at least one computer system board mounted within a protective chassis formed of a hardened material such as steel. Most commonly, a computer system board which is mounted within a protective chassis is comprised of a plurality of electronic components having multiple pin connectors mounted on an underlying substrate which provides interconnections between the connector pins of the various electronic components. As most electronic components typically include at least one connector pin which must be connected to ground, providing a conductive path from each electronic component to ground has long been an important concern in designing computer system boards. As the protective chassis within which the computer system board is typically mounted is often utilized as the ground for the computer system board and its components, it is often necessary to furnish a conductive path from the computer system board to the protective chassis. Most commonly, the computer system board is provided with a ground point that is electrically connected to the electrical components requiring a path to ground. The ground point is then electrically connected to the chassis. However, because of the high density of electrical components mounted on a typical computer system board, most computer system boards require more than one independent grounding point to fully satisfy the board's grounding needs. As a result, multiple electrical connections between the computer system board and the chassis are often required.

In addition to grounding requirements, computer system boards also demand support and mounting requirements. In most computer systems, the computer system board is supportably mounted directly above the chassis in order to optimize grounding connections and flexibility. However, because the electrical components mounted on the computer system board utilize the chassis as a ground, direct contact between the chassis and the electrical components must be avoided, as such contact could create a short-to-ground for the electrical components. The mounted system board, therefore, must be firmly secured above the chassis, since any excessive vibration that allows the board to contact the chassis could create a short circuit and potentially inflict irreparable harm to the board and its components. Finally, it is advantageous if the board is configured such that the installation and/or removal of the board may be completed without disrupting other components within the computer chassis. It is well understood by service personnel that limiting access and removal of the system board can create problems during field repair.

While prior ground clips satisfactorily provided a path from the electrical components to ground, such ground clips failed to provide mechanical support sufficient to maintain the board above the chassis. Furthermore, such prior clips were not configured to promote the slideable installation of the board. For example, in a "unit-to-unit" ground, a system board is inserted into a docking bay wherein a grounding contact between the two is formed. The unit-to-unit ground, however, fails to provide any shock or vibration protection for the system board. The required stability can only be accomplished by additionally fastening the board to the chassis.

Support of the system board has been addressed separately. Presently, many computer systems are provided with posts or premounted standoffs for supporting and securing the system board above the chassis. Most commonly, these standoffs are formed as vertically oriented chassis projections which engage the bottom of the system board. The system board is provided with corresponding apertures positioned directly above the standoff so that the board may be screw mounted to the standoff. While the use of standoffs securely mounts the system board to the chassis, their use is not particularly well suited for many applications. In particular, standoffs severely limit flexibility in designing the system board. Specific board locations must be selected and dedicated for a series of screw mounting apertures which correspond to the standoff locations on the chassis. Once selected, the aperture locations may not be modified without modifying the chassis as well. As a result, the exchangeability between system boards and chassis are hindered because the screw mounting holes and standoffs for the system board/chassis configuration for a first computer system are usually provided in different locations than the screw mounting holes and standoffs for the system board/chassis configuration of a second computer system. A separate chassis, therefore, must be manufactured for each type of system board such that the chassis standoffs correspond to the mounting holes on the boards. Furthermore, because of their locational inflexibility, the standoffs are sometimes not suitable for functioning as the only grounding connection for the system board. Accordingly, separate grounding connections must be provided. Finally, due to the rigid construction of the standoffs, the system board can only be lowered onto the standoffs. Laterally sliding the system board into a predesignated slot would likely result in damage or removal of the electrical components or circuitry on the under-side of the board.

SUMMARY OF THE INVENTION

In one embodiment, the present invention is of a supportive ground clip for a computer system board mounted in a computer chassis. The supportive ground clip includes a base member for providing a grounding connection with said computer chassis, first and second flexible support members attached to opposite ends of the base member and means, attached to the flexible support member, for mounting the supportive ground clip to the computer system board. Each of the flexible support members includes a contact point for providing a grounding connection with the bottom side of the computer system board and the mounting means includes a pair of contact points for providing a grounding connection with the top side of the computer system board. The first and second flexible support members are shaped such that compressive forces exerted on the supportive ground clip support the computer system board within the chassis. In one aspect of this embodiment of the invention, the contact points which provide a grounding connection with the bottom side of the computer system board are biased against the bottom side by the compressive forces exerted on the supportive ground clip. In another aspect of this embodiment of the invention, the supportive ground clip further includes resiliently bending pivot sections which join the ends of the base to the first and second support members. In this aspect of the invention, the pivot section absorbs compressive forces exerted on the supportive ground clip to support the computer system board mounted in the chassis. In still another aspect of this embodiment of the invention, the supportive grounding clip further includes first and second ascending vertical members attached to the first and second support members, respectively. In this aspect of the invention, the base of the supportive ground clip is arcuately shaped to bias the ascending vertical members against aperture sidewalls included as part of the computer system board.

In another embodiment, the present invention is of a one-piece, integrally formed supportive ground clip for a computer system board supportably mounted on a base of a computer chassis. The supportive ground clip includes a flexibly resilient arcuate base member for providing a grounding connection with the chassis base, first and second flexible hinges integrally formed at opposite ends of the arcuate base member for supporting the board on the chassis base, flexible support members integrally formed with the flexible hinges for contacting the bottom side of the computer system board to provide first and second grounding connections, ascending vertical members integrally formed with the flexible support members for extending through apertures in the computer system board, and descending vertical members integrally formed with the ascending vertical members for contacting the top side of the computer system board to provide third and fourth grounding connections for the board. The flexible hinges also bias the flexible support members against the bottom side of the board and the arcuate base member biases the ascending vertical members against the aperture sidewall. In one aspect of this embodiment, the flexible support members include an ascending section integrally formed with the corresponding hinge and a descending section integrally formed with the corresponding ascending vertical member such that a junction of the ascending section and said descending section contacts the bottom side of the computer system board.

In yet another embodiment, the present invention is of a method for installing a grounded printed circuit board in a computer chassis. First, at least one electrically conductive grounding clip is mounted in an aperture provided in the board such that at least part of the grounding clip extends below the board. The grounding clips are positioned to engage grounding pads positioned adjacent to the apertures, thereby providing a grounding path from electronic components mounted on the board to the grounding clips. The board is then slideably installed within the chassis while maintaining the board above the base of the chassis by the engagement of the grounding clips and the base. A grounding path between the electronic components to the base is then provided via the grounding pads and the grounding clips. In one aspect of this embodiment, grounding clips are mounted in apertures provided at spaced locations on the board, thereby providing for the support of the board after installation.

It is an object of this invention to provide a single apparatus that facilitates the insertion and removal of a computer system board from a computer chassis, while at the same time, grounding the components on the system board and supporting the system board above the chassis.

It is another object of this invention to provide design flexibility for computer system boards and computer chassis, such that a single chassis can be constructed that would accommodate several types of computer system boards.

It is yet another object of this invention to eliminate the use of standoffs to mechanically support a computer system board within a computer chassis.

It is still yet another object of this invention to establish reliable electrical grounding between the computer system board and the chassis at various locations.

BRIEF DESCRIPTION OF THE DRAWINGS

The invention may be better understood and its numerous objects, features and advantages become apparent to those skilled in the art by referencing the accompanying drawings in which.

DETAILED DESCRIPTION OF THE INVENTION

Figure 1:
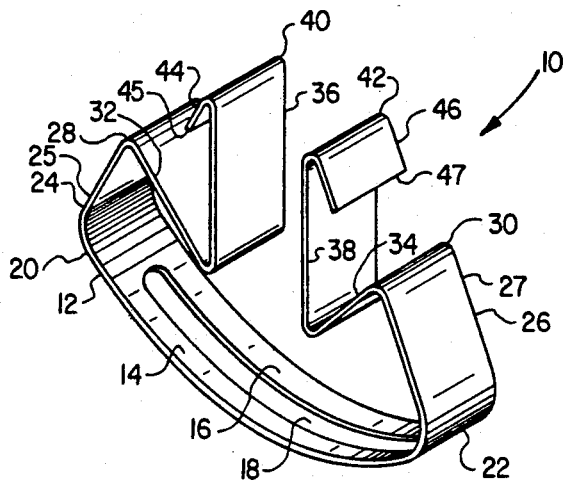
FIG. 1 is a perspective view of a supportive ground clip for a computer system board constructed in accordance with the teachings of the present invention.
Figure 4:
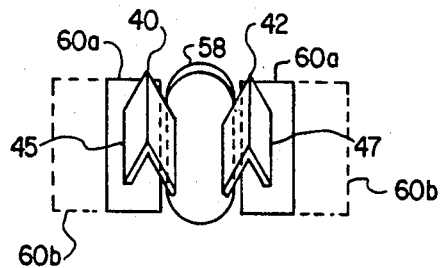
FIG. 4 is an enlarged perspective view of the supportive ground clip illustrated in FIG. 2.

Referring first to FIG. 1, a supportive ground clip 10 constructed in accordance with the teachings of the present invention may now be seen. The supportive ground clip 10 may be formed using a thin strip of any flexible conductive material suitable for the uses contemplated herein, although, in the preferred embodiment of the invention, the supportive ground clip 10 should be formed using a 0.008 inch thick strip of a tin plated, copper alloy containing Beryllium.

Continuing to refer to FIG. 1, the supportive ground clip 10 includes an arcuate base member 12 comprised of first and second elongated contactors 14 and 16 positioned substantially parallel to each other and separated by a laterally extending slot 18. First and second contactors 14 and 16 are integrally joined together at first and second ends 20 and 22 of the arcuate base member 12. Integrally formed with the first and second ends 20 and 22 are first and second flexible support members 24 and 26. The flexible support members 24, 26 extend upwardly from the ends 20, 22, respectively, at an angle such that the distance separating corresponding points at the top of the first and second flexible support members 24 and 26 is less than the distance separating corresponding points at the bottom of the first and second support members 24 and 26. Preferably, the ends 20, 22 should be bent into an arcuate curve such that ascending sections 25, 27 of the flexible support members 24, 26 extend upwardly from the corresponding ends 20, 22 at a generally ninety degree angle. This bend between the ends 20, 22 and the flexible support members 24, 26 form flexible hinges for the supportive ground clip 10.

The ascending sections 25, 27 of the first and second flexible support members 24 and 26 continue to extend upward and inwardly until bending downwardly at crests 28, 30, respectively. Descending inwardly from and integrally formed with the crests 28, 30 are descending sections 32, 34 of the flexible support members 24, 26. Preferably, the descending sections 30, 32 should be bent at a generally ninety degree angle to the ascending sections 25, 27. The descending sections 32, 34 are then bent upwardly at, preferable at an acute angle, to form first and second vertical ascending members 36, 38. Preferably, the vertical ascending members 36, 38 are positioned generally perpendicular to the center of the arcuate base member 12. The other ends of the vertical ascending members 36, 38 are bent outward and downwardly at peaks 40, 42, again, preferably at yet another acute angle, to form descending members 44, 46, which terminate at ends 45, 47, respectively.

Figure 2:
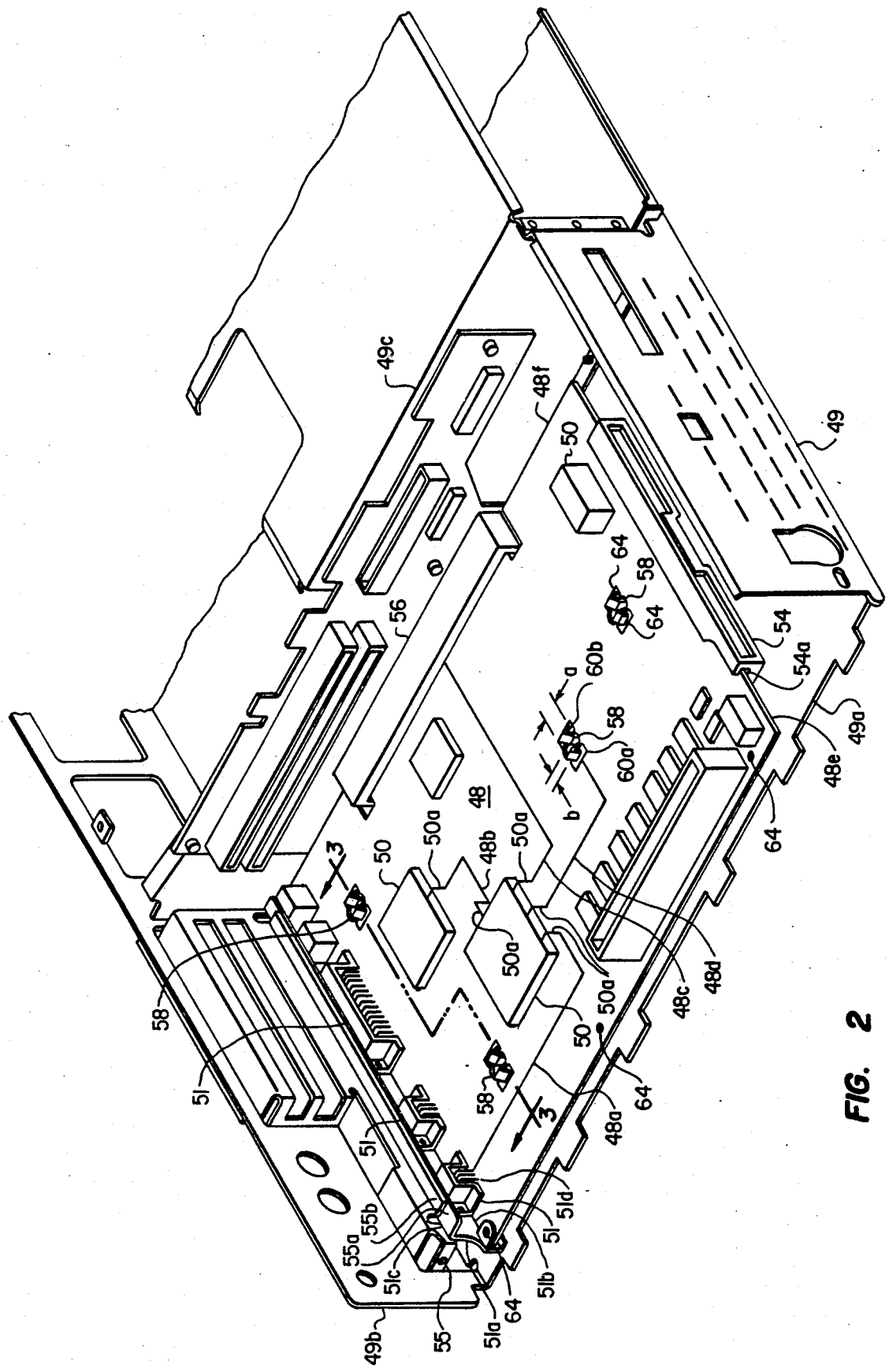
FIG. 2 is a perspective view of a computer system board supportably mounted within a computer chassis using the supportive ground clip illustrated in FIG. 1.

Referring next to FIG. 2, there is shown a perspective view of a printed circuit board 48 mounted within a protective computer chassis 49 constructive of a hardened conductive material such as steel. For ease of illustration, the printed circuit board 48 includes only a selected number of the electronic components 50 which would be typically mounted thereon. Also for ease of illustration, while each electronic component 50 would typically include sixteen or even more pin connectors, only five pin connectors 50a are illustrated in the drawing. Finally, while the printed circuit board 48 would include numerous electrical connectors, any number of which may be formed along the top side of, the bottom side of, or internal to, the printed circuit board 48, the drawing illustrates only four electrical connectors 48a, 48b, 48c, and 48d, all of which are illustrated as being formed on the top side of the printed circuit board 48 but which could very readily have been formed on the bottom side of or internal to the printed circuit board 48. The first electrical connector 48a provides for connection between external input/output devices (not shown) and the electrical components 50. The second electrical connector 48b provides for electrical connection between a pair of electronic components 50. The third electrical connector 48c provides for electrical connection between an electrical component 50 and other internal computer components (not shown), such as peripheral input/output means such as a disk drive or a hard disk or a power supply, mounted within the chassis 49. Finally, the fourth electrical connector 48d provides for electrical connection between an electrical component 50 and a grounding pad 60a to be more fully described below.

To connect the printed circuit board 48 to external I/O devices (not shown) such as a printer, display, modem or other device typically associated with a computer system, a series of connectors 51 are mounted along a first edge of the printed circuit board 48. Each connector 51 is screw mounted to a common connector panel 51a which is preferably constructed of a conductive material as part of a path to ground for electrostatic discharge events which are propagated to the connectors 51. Preferably, the connector panel 51a includes a side panel 51b integrally formed with a top panel 51c.

Each connector 51 includes at least one connector pin 51d which, depending on the particular type of connector 51 utilized, on one end, will either project from, lay flush with, or be recessed within the side (not shown) of the connector 51 from which external access is provided, and which is electrically connected to the printed circuit board 48 on the other end. Finally, the printed circuit board 48 is also provided with a selected number of apertures 58 for mounting the supportive ground clips 10 thereto as well as a series of secondary support apertures 64, both of which shall be more fully described below.

Continuing to refer to FIG. 2, the supportive ground clips 10 are mounted to the printed circuit board 48 to support the printed circuit board 48 above a base 49a of the chassis 49. Further support of the printed circuit board 48 is provided by a first slidable entry guide 54, preferably constructed of an insulative material such as plastic, which is mounted on the base 49a and a second slidable entry guide 55 which is mounted to a sidewall 49b of the chassis 49. While first and second slideable entry guides 54, 56 assist in the installation of the printed circuit board 48 within the chassis 49 in accordance with one aspect of the present invention, once installed, the first slideable entry guide 54 supports a first edge 48e of the printed circuit board 48, the second slideable entry guide 55 supports the connector panel 51a and an interface 56 mounted to an inner chassis plate 49c supports a front edge 48f of the printed circuit board 48.

To mount the printed circuit board 48 within the chassis 49, the ground clips 10 are first installed on the printed circuit board 48. The front edge 48f of the printed circuit board 48 and the connector panel 51a are approximately simultaneously inserted into a groove 54a formed in the first slidable entry guide 54 and a space 55a defined by a top panel 55b of second slideably entry guide 55 and the base 49a of the chassis 49, respectively. The printed circuit board 48 is then slid forward until the front edge 48f of the printed circuit board 48 engages the interface 56. When installing (as well as extracting) the printed circuit board 48, the arcuate base member 12 slides over the base 49a of the chassis 49. Supportive ground clip 10 remains in place by the engagement of the vertical ascending members 36, 38 with the sidewall 62 of the aperture 58. The crests 28, 30 and the ends 45, 47 further secure supportive ground clip 10 in place during the sliding process. The rear edge 48g of the printed circuit board 48 is then secured by screwmounting the rear edge 48g to a rear bracket (not shown) by inserting screws through apertures 64 where they may engage the rear bracket.

The present invention eliminates the need to lower the printed circuit board 48 onto standoffs which, in accordance with the teachings of the prior art, projected from the base of the computer chassis, during the installation of the printed circuit board 48 as well as eliminates the need for the aforementioned standoffs to support the printed circuit board 48 once installed. The slideable installation of the printed circuit board 48 permitted by the utilization of supportive ground clips 10 assists a technician servicing a computer system by permitting a faster extraction of the installed printed circuit board since screws previously required to secure the printed circuit board 48 to the standoffs are no longer needed.

As FIG. 2 makes clear, installation and extraction of the printed circuit board 48 is greatly facilitated by the use of the supportive ground clips 10. The technician merely slides the printed circuit board 48 along the base 49a of the chassis 49 until the front edge 48f engages the interface 56. The present invention also improves the interchangeability of printed circuit boards 48 within a chassis 49. As is well known in the art, the grounding requirements for two differently designed printed circuit boards 48 are quite distinct. For example, depending on the particular type and number electronic components 50 mounted on the printed circuit board 48, the preferred number and location of ground points vary. In the past, when standoffs fixedly secured to the chassis were utilized as paths to ground, the ability to modify the grounding paths when a first printed circuit board was replaced with a second, different, printed circuit board was severely limited. In contrast, the present invention provides for dramatically improved grounding point flexibility since the location and number of grounding points is completely controlled by the printed circuit board 48.

Prior to installing the printed circuit board 48, however, the technician must first install the supportive ground clips 10 to the printed circuit board 48. Referring now to FIGS. 1, 2, 3, and 4, in combination, the uninserted supportive ground clip 10 is first compressed, preferably by grasping the flexible support members 24, 26 at or near the flexible hinges such that the vertical ascending members 36, 38 approach each other a sufficient distance so that the ends 45, 47 are separated by a distance less than the shorter axis (length "b") of the general elliptically shaped aperture 58. The supportive ground clip 10 is inserted through the aperture 58 from the bottom side of the printed circuit board 48 with the ends 45, 47 extending lengthwise along the longer axis of (length "a") of the aperture 58. The supportive ground clip 10 is inserted through the aperture 58 until the crests 28, 30 contact the bottom side of the printed circuit board 48. At this point, the ends 45, 47 of the supportive ground clip 10 should be projecting from the top side of the printed circuit board 48. The compressive pressure is now released so that the arcuate base member 12 may bias the vertical ascending members 36, 38 against a sidewall 62 which defines the aperture 58. The release of the compressive pressure also biases the ends 45, 47 and the crests 28, 30 such that the ends 45, 47 engage the grounding pads 60a, 60b on the top side of the printed circuit board 48 and the crests 28, 30 engage grounding pads 60c, 60d on the bottom side of the printed circuit board 48. A first wiping action which cleans the grounding pads 60a, 60b, 60c, and 60d and facilitates the creation of a proper grounding connection is produced when the ends 45, 47 and the crests 28, 30 are biased into contact with the grounding pads 60a, 60b, 60c and 60d, respectively, by the release of the compressive pressure. A second wiping action is produced during the previously described installation and/or extraction of the printed circuit board 48 when the ends 45, 47 and the crests 28, 30 undergo a relatively small motion when the supportive ground clip 10 is compressed by the base 49a of the chassis 49 during the installation and/or extraction of the printed circuit board 48.

Figure 3:
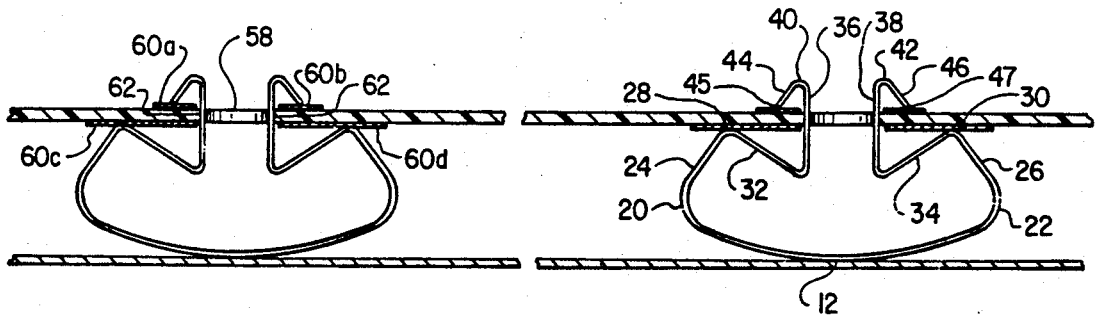
FIG. 3 is a cross-sectional view taken along lines 3—3 of FIG. 2.

As may be seen in FIG. 3, the grounding pads 60c, 60d on the bottom side of the printed circuit board 48 are provided with a larger surface area than the grounding pads 60a, 60b on the top side of the printed circuit board 48. The larger surface area is required in order to accommodate the greater distance between the crests 28, 30 than between the ends 45, 47. As may also be seen in FIG. 3, the arcuate base member 12 flattens under pressure from the printed circuit board 48 such that the surface area of the arcuate base member 12 that is in contact with the base 49a of the chassis 49 increases. This increased surface area insures a proper electrical correction has been established. Furthermore, the weight of the printed circuit board 48 facilitates the support function of the supportive ground clip 10 as well. As the weight of the printed circuit board 48 pushes down on the supportive ground clip 10, the crests 28, 30 are pushed outward, thereby increasing the stability of the supportive grounding clip 10 as well as providing a secure connection between the supportive grounding clip 10 and the printed circuit board 48. As a result of this secure connection, the grounding connection between remains intact in the presence of vibrations transmitted to the chassis 49. Additionally, a gas-tight connection seal is achieved both through the compressive force due to the interaction of the end 45, 47 and crests 28, 30 of the supportive ground clip 10 on the printed circuit board 48 and, after installation of the printed circuit board 48, the compressive force due to the interaction of the crests 28, 30 pushing upwards on the printed circuit board 48 and the various mounting devices (i.e., first slidable entry guide 54, second slideable entry guide 55, interface 56) provided around the perimeter of the printed circuit board 48 which holding the printed circuit board 48 down. This creation of a gas-tight connection seal is important because the seal excludes gas capable of corroding the grounding contact points for the supportive ground clip 10. Any corrosion at these points would hinder the electrical grounding connection required for the proper operation of the supportive ground clip 10. Finally, the contactors 14, 16 provide a dual path to ground, thereby ensuring an effective grounding connection between the supportive ground clip 10 and the chassis 49. The effective grounding connection is ensured because the contactors 14, 16 provide redundant paths to ground. If, for example, an imperfection exists on the base 49a or if a dust particle becomes lodged between the base 49a and one of the contactors 14, 16, the other contactor 14, 16 will still provide a path to ground.

Thus, there has been described and illustrated herein a supportive ground clip for a printed circuit board which provides a ground connection for the board, supportably mounts the board over the base of the computer chassis and which permits the slideable installation and extraction of the board. Those skilled in the art, however, will recognize that many modifications and variations besides those specifically mentioned may be made in the techniques described herein without departing substantially from the concept of the present invention. Accordingly, it should be clearly understood that the form of the invention as described herein is exemplary only and is not intended as a limitation on the scope of the invention.

What is claimed:

1. A method of installing a grounded printed circuit board in a computer chassis, comprising the steps of:
   providing a printed circuit board having a front edge, top and bottom side surfaces and at least one aperture extending between said top and bottom side surfaces, said printed circuit board having a grounding pad mounted on said top side surface adjacent to each of said at least one aperture and connector means mounted on said top side surface and positioned adjacent to said front edge;

insertably mounting an electrically conductive grounding clip in each of said at least one aperture such that a first portion of said grounding clip mounted in each of said at least one aperture extends below said board;

positioning said grounding clip mounted in each of said at least one aperture to engage said adjacent grounding pad on said top side surface;

providing a computer chassis having a base, a sidewall portion and interface connection means mounted on said sidewall portion;

slideably installing said board within said chassis by sliding said board across said base of said chassis until said connector means operatively engages said interface connection means;

maintaining said board above said base during said installing step, thereby preventing damage to said board, said first portion of said grounding clip mounted in each of said at least one aperture extending below said board and engaging said base to maintain said board above said base while simultaneously providing a grounding path from said grounding pad on said top side surface adjacent each of said at least one aperture to said base through said grounding clip mounted in each of said at least one aperture; and maintaining said grounding path after operative engagement of said connector means and said interface connection means.

2. A method as set forth in claim 1 and further comprising the step of insertably mounting a plurality of electrically conductive grounding clips in apertures positioned at spaced locations on said board, said plurality of mounted grounding clips supporting said installed board.

3. A method as set forth in claim 1 wherein the step of insertably mounting an electrically conductive grounding clip in each of said at least one aperture such that a first portion of said grounding clip mounted in each of said at least one aperture extends below said board further comprises the steps of:

compressing each said grounding clip;

inserting each said grounding clip through said corresponding aperture; and releasing each said compressed grounding clip, each said released grounding clip springingly engaging said board.

4. A method as set forth in claim 3 wherein the step of releasing each said compressed grounding clip further comprises the step of wiping said grounding pad engaged by each said grounding clip.

5. A method as set forth in claim 1 wherein the step of maintaining said board above a base of said chassis during said installing step further comprises the step of sliding each said mounted grounding clip across said base.

6. A method as set forth in claim 5 and further comprising the steps of providing slotted guide means mounted on said base, said slotted guide means sized to receive first and second side edges of said board, and wherein the step of slideably installing said board within said chassis further comprises the steps of:

inserting said first and second side edges of said board into said slotted guide means; and sliding said board across said base until said connection means operatively engages said interface connection means.

7. A method of installing a grounded printed circuit board in a computer chassis, comprising the steps of:

providing a printed circuit board having top and bottom sides and at least one aperture extending therethrough, said printed circuit board having first and second grounding pads mounted on the top and bottom sides, respectively, adjacent to each of said at least one aperture;

insertably mounting a grounding clip in each of said at least one aperture adjacent to said grounding pads;

positioning said grounding clip in said corresponding aperture such that a first part of said grounding clip contacts said first and second grounding pads on said top side of said printed circuit board and a second part of said grounding clip projects downwardly from and contacts said first and second grounding pads on said bottom side of said printed circuit board;

slideably installing said printed circuit board within said computer chassis; and securing said slideably installed printed circuit board such that said grounding clip provides a conductive path from said grounding pads to a base of said computer chassis.

8. A method according to claim 7 wherein the step of slideably installing said printed circuit board within said computer chassis further comprises the steps of:

positioning said printed circuit board to be generally parallel with and spaced above said base of said computer chassis a distance slightly less than the downward projection of said second part of said grounding clip below said bottom side of said printed circuit board;

said base of said chassis compressing said grounding clip during said slideable installation of said printed circuit board, said compression causing said grounding clip to wipe said first and second pads on said top and bottom sides, respectively.

9. A method according to claim 8 wherein the step of insertably mounting a grounding clip in each of said at least one aperture further comprises the steps of:

compressing said grounding clip;

inserting said grounding clip through said corresponding aperture such that said first part projects above said top surface of said printed circuit board and said second part projects below said bottom surface of said printed circuit board; and releasing said compressed grounding clip, said released grounding clips springingly engaging said board.

10. A method according to claim 9 wherein the step of releasing said compressed grounding clip further comprises the steps of:

wiping, with said first part of said grounding clip, said first and second grounding pads on said top surface of said printed circuit board; and wiping, with said second part of said grounding clip, said first and second grounding pads on said bottom surface of said printed circuit board.

11. A method of installing a grounded printed circuit board in a computer chassis, comprising the steps of:

providing a printed circuit board having a front edge, first and second side edges, top and bottom side surfaces and at least one aperture extending between said top and bottom side surfaces, said printed circuit board having a grounding pad mounted on one of said side surfaces adjacent to each of said at least one aperture;

insertably mounting an electrically conductive grounding clip in each of said at least one aperture such that said grounding clip engages said grounding pad adjacent said aperture and a first portion of said grounding clip mounted in each of said at least one aperture extends below said board;

providing a computer chassis having first and second slotted guides mounted thereto, said computer chassis having a base, a sidewall portion and interface connection means mounted on said sidewall portion;

inserting said first and second side edges of said board within said first and second slotted guides, respectively;

slideably installing said board within said chassis by sliding said board across said base until said board operatively engages said interface connection means;

maintaining said board above said base during said installing step, said first and second slotted guides and said first portion of said grounding clip mounted in each of said at least one aperture maintaining said board above said base, said grounding clip mounted in each of said at least one aperture simultaneously providing a grounding path from said grounding pad adjacent each of said at least one aperture to said base; and maintaining said grounding path after operative engagement of said board and said interface connection means.

12. A method as set forth in claim 11 wherein said first and second slotted guides are mounted on said base.

* * * * *